United States Patent
Yi et al.

(10) Patent No.: US 9,863,650 B2
(45) Date of Patent: Jan. 9, 2018

(54) HEAT DISSIPATION STRUCTURE OF FAN DRIVE OF AIR CONDITIONER OUTDOOR UNIT, AND AIR CONDITIONER OUTDOOR UNIT

(71) Applicant: Huawei Technologies Co., Ltd., Shenzhen (CN)

(72) Inventors: Jie Yi, Xi'an (CN); Jie Tang, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 219 days.

(21) Appl. No.: 14/925,691

(22) Filed: Oct. 28, 2015

(65) Prior Publication Data
US 2016/0123348 A1 May 5, 2016

(30) Foreign Application Priority Data
Oct. 31, 2014 (CN) .......................... 2014 1 0605773

(51) Int. Cl.
*F04D 29/58* (2006.01)
*F25B 39/04* (2006.01)
(Continued)

(52) U.S. Cl.
CPC ............ *F24F 1/24* (2013.01); *F04D 29/5806* (2013.01); *F04D 29/5813* (2013.01); *F24F 1/06* (2013.01); *H05K 7/2089* (2013.01)

(58) Field of Classification Search
CPC .... F04D 29/5806; F04D 29/5813; F24F 1/06; F24F 1/24; H05K 7/20127; H05K 7/20163; H05K 7/2089
See application file for complete search history.

(56) References Cited

U.S. PATENT DOCUMENTS 6,104,602 A * 8/2000 Morris ............... H05K 7/20127
165/185
6,742,583 B2 * 6/2004 Tikka ..................... H05K 7/206
165/261
(Continued)

FOREIGN PATENT DOCUMENTS

CN 201363862 Y 12/2009
CN 201757610 3/2011
(Continued)

OTHER PUBLICATIONS

First Office Action regarding Application 201410605773.2 before the State Intellectual Property Office of People's Republic of China.*
(Continued)

*Primary Examiner* — Christopher R Zerphey
(74) *Attorney, Agent, or Firm* — Slater Matsil, LLP

(57) ABSTRACT

A heat dissipation structure of a fan drive of an air conditioner outdoor unit, and an air conditioner outdoor unit are provided. A side plate of the air conditioner outdoor unit is disposed between a side plate of the fan drive and a baffle plate, and the side plate of the air conditioner outdoor unit clings to the side plate of the fan drive; a first air vent communicating with the outside of the air conditioner outdoor unit is provided on the side plate of the air conditioner outdoor unit; and a second air vent is provided on the baffle plate, the first air vent and the second air vent form an air duct between the side plate of the air conditioner outdoor unit and the baffle plate, and the second air vent enables the first air vent to communicate with an inner chamber of the air conditioner outdoor unite.

15 Claims, 8 Drawing Sheets

(51) Int. Cl.
*F24F 1/24* (2011.01)
*H05K 7/20* (2006.01)
*F24F 1/06* (2011.01)

(56) References Cited

U.S. PATENT DOCUMENTS

| | | | |
|---|---|---|---|
| 8,320,750 B2 | 11/2012 | Han et al. | |
| 8,611,088 B2 * | 12/2013 | Barna | H05K 7/20145 165/104.33 |
| 8,687,363 B2 * | 4/2014 | Moore | H05K 7/20163 361/690 |
| 8,763,416 B2 * | 7/2014 | Hika | F24F 1/22 312/100 |
| 9,504,182 B2 * | 11/2016 | Olsson | H02B 1/56 |
| 2009/0081940 A1 * | 3/2009 | Jang et al. | F24F 1/22 454/184 |
| 2010/0185332 A1 * | 7/2010 | Schmidt | H05K 7/206 700/276 |
| 2011/0192173 A1 * | 8/2011 | Walter | H05K 7/20618 62/3.3 |
| 2014/0124175 A1 * | 5/2014 | Sao | F24F 1/38 165/121 |

FOREIGN PATENT DOCUMENTS

| | | |
|---|---|---|
| CN | 202769837 U | 3/2013 |
| CN | 103615771 A | 3/2014 |
| EP | 1416230 A1 | 5/2004 |
| JP | 200356865 A | 2/2003 |
| JP | 2014105948 A | 6/2014 |

OTHER PUBLICATIONS

Second Office Action regarding Application 201410605773.2 before the State Intellectual Property Office of People's Republic of China.*

* cited by examiner ns that the second air vent form an air duct between the side plate of the air conditioner outdoor unit and the side plate of the fan drive, and the second air vent enables the first air vent to communicate with an inner chamber of the air conditioner outdoor unit.

HEAT DISSIPATION STRUCTURE OF FAN DRIVE OF AIR CONDITIONER OUTDOOR UNIT, AND AIR CONDITIONER OUTDOOR UNIT

This application claims priority to Chinese Patent Application No. 201410605773.2 filed on Oct. 31, 2014, which is hereby incorporated by reference in its entirety.

TECHNICAL FIELD

The present invention relates to communications technologies, and in particular, to a heat dissipation structure of a fan drive of an air conditioner outdoor unit, and an air conditioner outdoor unit.

BACKGROUND

A high temperature not only leads to an unstable operation of a fan drive and shortens a service life, but even may burn some elements of the fan drive.

In the prior art, a manner of natural heat dissipation is generally used for dissipating heat from a fan drive that drives a condenser in an air conditioner outdoor unit. Components are installed on an inner side of a housing of the fan drive, and a heat dissipation device is installed on an outer side of the housing of the fan drive, so that heat dissipation is performed on the fan drive by using the heat dissipation device. The heat dissipation device may be made of a material of copper or aluminum.

However, in the prior art, when heat dissipation is performed on a fan drive by using a heat dissipation device, a problem of a complicated heat dissipation structure exists.

SUMMARY

Embodiments of the present invention provide a heat dissipation structure of a fan drive of an air conditioner outdoor unit, and an air conditioner outdoor unit.

An embodiment of the present invention provides a heat dissipation structure of a fan drive of an air conditioner outdoor unit, including a side plate of the air conditioner outdoor unit and a baffle plate. The side plate of the air conditioner outdoor unit is disposed between a side plate of the fan drive and the baffle plate, a gap exists between the side plate of the air conditioner outdoor unit and the baffle plate, and the side plate of the air conditioner outdoor unit clings to the side plate of the fan drive. The side plate of the air conditioner outdoor unit is provided with a first air vent, and the first air vent communicates with the outside of the air conditioner outdoor unit. A second air vent is provided on the baffle plate, the first air vent and the second air vent form an air duct between the side plate of the air conditioner outdoor unit and the baffle plate, and the second air vent enables the first air vent to communicate with an inner chamber of the air conditioner outdoor unit.

An embodiment of the present invention further provides a heat dissipation structure of a fan drive of an air conditioner outdoor unit, including a side plate of the air conditioner outdoor unit and a connecting plate. A gap exists between the side plate of the air conditioner outdoor unit and a side plate of the fan drive, the connecting plate is connected to the side plate of the fan drive and the side plate of the air conditioner outdoor unit, and the connecting plate includes a first connecting sub-plate. The first connecting sub-plate is provided with a first air vent, and the first air vent communicates with the outside of the air conditioner outdoor unit. The side plate of the air conditioner outdoor unit is provided with a second air vent, the first air vent and the second air vent form an air duct between the side plate of the air conditioner outdoor unit and the side plate of the fan drive, and the second air vent enables the first air vent to communicate with an inner chamber of the air conditioner outdoor unit.

An embodiment of the present invention provides an air conditioner outdoor unit, including the heat dissipation structure of the fan drive of the air conditioner outdoor unit according to any one of the foregoing items.

The embodiments of the present invention provide a heat dissipation structure of a fan drive of an air conditioner outdoor unit, and an air conditioner outdoor unit. A side plate of the air conditioner outdoor unit is disposed between a side plate of the fan drive and a baffle plate, and the side plate of the air conditioner outdoor unit clings to the side plate of the fan drive. A first air vent communicating with the outside of the air conditioner outdoor unit is provided on the side plate of the air conditioner outdoor unit; and a second air vent is provided on the baffle plate, the first air vent and the second air vent form an air duct between the side plate of the air conditioner outdoor unit and the baffle plate, and the second air vent enables the first air vent to communicate with an inner chamber of the air conditioner outdoor unit, so that heat dissipation on a fan drive can be implemented in a manner of adding a baffle plate and providing air vents on a side plate of an air conditioner outdoor unit and on the baffle plate, thereby simplifying a heat dissipation structure of the fan drive.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

DETAILED DESCRIPTION OF ILLUSTRATIVE EMBODIMENTS

To make the objectives, technical solutions, and advantages of the embodiments of the present invention clearer, the following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

A first embodiment (Embodiment 1) of heat dissipation structure of fan drive of air conditioner outdoor unit will now be described.

Figure 1:
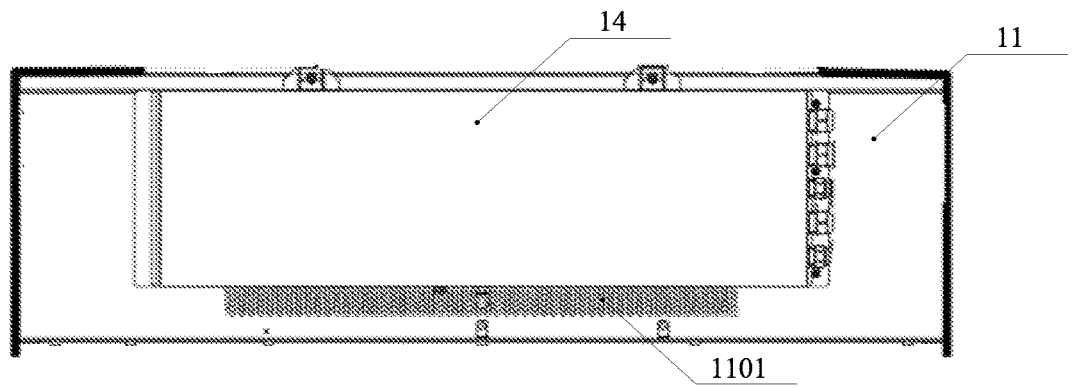
FIG. 1 is main view 1 of a heat dissipation structure of a fan drive of an air conditioner outdoor unit according to an embodiment of the present invention.
Figure 2:
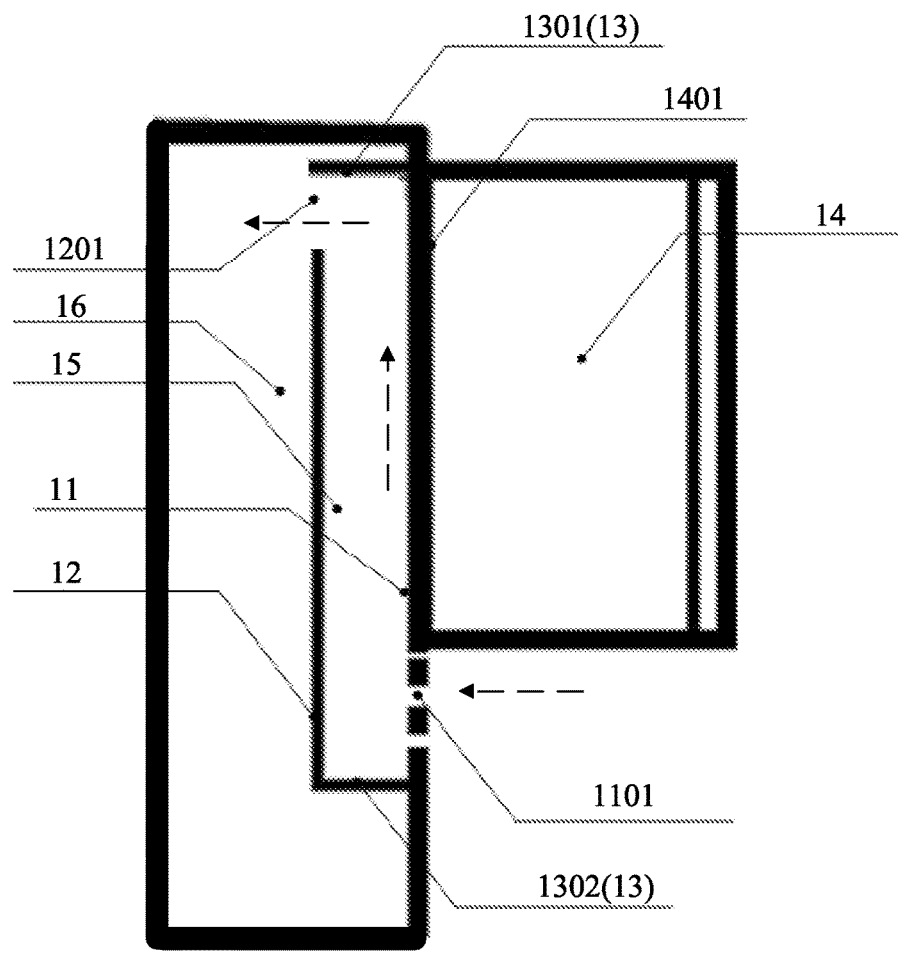
FIG. 2 is left view 1 of the heat dissipation structure of the fan drive of the air conditioner outdoor unit according to the embodiment of the present invention.

FIG. 1 is main view 1 of a heat dissipation structure of a fan drive of an air conditioner outdoor unit according to an embodiment of the present invention; and FIG. 2 is left view 1 of the heat dissipation structure of the fan drive of the air conditioner outdoor unit according to the embodiment of the present invention. As shown in FIG. 1 to FIG. 2, the heat dissipation structure of this embodiment includes: a side plate 11 of the air conditioner outdoor unit and a baffle plate 12. The side plate 11 of the air conditioner outdoor unit is disposed between a side plate 1401 of the fan drive and the baffle plate 12, a gap 15 exists between the side plate 11 of the air conditioner outdoor unit and the baffle plate 12, and the side plate 11 of the air conditioner outdoor unit clings to the side plate 1401 of the fan drive.

The side plate 11 of the air conditioner outdoor unit is provided with a first air vent 1101, and the first air vent 1101 communicates with the outside of the air conditioner outdoor unit; and a second air vent 1201 is provided on the baffle plate 12, the first air vent 1101 and the second air vent 1201 form an air duct (indicated by dotted lines in FIG. 2) between the side plate 11 of the air conditioner outdoor unit and the baffle plate 12, and the second air vent 1201 enables the first air vent 1101 to communicate with an inner chamber 16 of the air conditioner outdoor unit.

The fan drive 14 is on one side of the side plate 11 of the air conditioner outdoor unit, the inner chamber 16 of the air conditioner outdoor unit is on the other side, and the baffle plate 12 is located in the inner chamber 16 of the air conditioner outdoor unit. Shapes of the side plate 11 of the air conditioner outdoor unit and the baffle plate 12 may be rectangular, square, circular, or the like.

Shapes of the first air vent 1101 and the second air vent 1201 may be cellular, rectangular, circular, or the like. One or more first air vents 1101 and one or more second air vents 1201 may exist.

A relationship among an air speed and an air volume in the air duct, and a cross-sectional area of the air duct is shown in a formula (1):

$$V = L(F \times 3600) \quad (1)$$

where V is the air speed in a unit of "meter/second"; L is the air volume in a unit of "cubic meter per hour"; and F is the cross-sectional area of the air duct in a unit of "square meter".

It should be noted that the cross-sectional area of the air duct is related to sizes of the gap, the first air vent, and the second air vent; and the sizes of the gap, the first air vent and the second air vent may be determined according to values of an actually required air volume and air speed.

In the prior art, a heat dissipation device is installed on an outer side of a housing of a fan drive, so that heat dissipation is performed on the fan drive by using the heat dissipation device. In the present invention, a side plate of an air conditioner outdoor unit is disposed between a side plate of a fan drive and a baffle plate, and the side plate of the air conditioner outdoor unit clings to the side plate of the fan drive; a first air vent communicating with the outside of the air conditioner outdoor unit is provided on the side plate of the air conditioner outdoor unit; and a second air vent is provided on the baffle plate, the first air vent and the second air vent form an air duct between the side plate of the air conditioner outdoor unit and the baffle plate, and the second air vent enables the first air vent to communicate with an inner chamber of the air conditioner outdoor unit.

In the prior art, a heat dissipation device needs to be installed on an outer side of a housing of a fan drive, so that heat dissipation is performed on the fan drive by using the heat dissipation device, but the heat dissipation device itself has a complicated structure, and therefore a problem that the fan drive has a complicated heat dissipation structure exists. In the present invention, a side plate of an air conditioner outdoor unit is disposed between a side plate of a fan drive and a baffle plate, and the side plate of the air conditioner outdoor unit clings to the side plate of the fan drive; a first air vent communicating with the outside of the air conditioner outdoor unit is provided on the side plate of the air conditioner outdoor unit; and a second air vent is provided on the baffle plate, the first air vent and the second air vent form an air duct between the side plate of the air conditioner outdoor unit and the baffle plate, and the second air vent enables the first air vent to communicate with an inner chamber of the air conditioner outdoor unit, so that heat dissipation on a fan drive is implemented in a manner of adding a baffle plate and providing air vents on a side plate of an air conditioner outdoor unit and on the baffle plate, thereby simplifying a heat dissipation structure of the fan drive.

A second embodiment (Embodiment 2) of heat dissipation structure of fan drive of air conditioner outdoor unit will now be described.

Based on Embodiment 1 of the heat dissipation structure of the fan drive of the air conditioner outdoor unit, optionally, the heat dissipation structure may further include a connecting plate 13. The connecting plate 13 is connected to the baffle plate 12 and the side plate 11 of the air conditioner outdoor unit. The connecting plate 13 includes a first connecting sub-plate 1301, a second connecting sub-plate 1302, a third connecting sub-plate (not shown), and a fourth connecting sub-plate (not shown. The baffle plate 12, the side plate 11 of the air conditioner outdoor unit, the first connecting sub-plate 1301, the second connecting sub-plate 1302, the third connecting sub-plate, and the fourth connecting sub-plate form an enclosed hexahedron. The baffle plate 12, the side plate 11 of the air conditioner outdoor unit, the first connecting sub-plate 1301, the second connecting sub-plate 1302, the third connecting sub-plate, and the fourth connecting sub-plate form the enclosed hexahedron, so that the air duct is prevented from being affected by another gap between the baffle plate 12 and the side plate 11 of the air conditioner outdoor unit.

Optionally, the baffle plate 12 is parallel with the side plate 11 of the air conditioner outdoor unit.

Optionally, the side plate 1401 of the fan drive is a bottom cover, on which an element of the fan drive is installed, of the fan drive; and contact heat dissipation is directly performed on the bottom cover on which the element of the fan drive is installed, thereby improving a heat dissipation effect.

Optionally, the first air vent 1101 and the second air vent 1201 are separately located on two sides of a central axis, perpendicular to the side plate 1401 of the fan drive, of the side plate 1401 of the fan drive. The first air vent and the second air vent are separately located on the two sides of the central axis, perpendicular to the side plate of the fan drive, of the side plate of the fan drive, so that the air duct, between the side plate of the air conditioner outdoor unit and the baffle plate, of the first air vent and the second air vent can cover a larger area of the side plate, tightly clinging to the side plate of the air conditioner outdoor unit, of the fan drive.

It should be noted that when an air conditioner is shut down and an internal temperature of the fan drive is higher than a preset temperature (for example, 75° C.), heat dissipation may be started for the fan drive; or heat dissipation may be performed on the fan drive while the air conditioner is operating.

Optionally, a fan driven by the fan drive may operate by extracting air or may operate by blowing air.

When the fan operates by extracting air, cool air outside the air conditioner outdoor unit enters between the side plate of the air conditioner outdoor unit and the baffle plate by means of the first air vent, and cools the fan drive that tightly clings to the side plate of the air conditioner outdoor unit. Hot air is then exhausted into the inner chamber of the air conditioner outdoor unit by means of the second air vent, and the hot air is extracted out by using the fan finally, thereby implementing heat dissipation on the fan drive by using the fan.

When the fan operates by blowing air, cool air outside the air conditioner outdoor unit is blown into the inner chamber of the air conditioner outdoor unit by using the fan, enters between the side plate of the air conditioner outdoor unit and the baffle plate by means of the second air vent, and cools the fan drive that tightly clings to the side plate of the air conditioner outdoor unit. Hot air is then blown out of the air conditioner outdoor unit by means of the first air vent, thereby implementing heat dissipation on the fan drive by using the fan.

When the air conditioner operates and the fan operates by extracting air, cool air outside the air conditioner outdoor unit enters by means of the first air vent and an air vent (for example, a fourth air vent) that is for performing heat dissipation on a condenser of the air conditioner, and cools the fan drive and the condenser, and hot air is then extracted out by using the fan, so that heat dissipation is performed on the fan drive by means of the first air vent and heat dissipation is performed on the condenser by means of the fourth air vent.

In this embodiment, heat dissipation on a fan drive is implemented in a manner of adding a baffle plate and providing air vents on a side plate of an air conditioner outdoor unit and on the baffle plate, so that a heat dissipation structure of a fan drive is simplified, while it is avoided to dispose a heat dissipation device for the fan drive, thereby reducing a weight and costs of the heat dissipation structure when compared with that a heat dissipation device is used as a heat dissipation structure of a fan drive.

A third embodiment (Embodiment 3) of heat dissipation structure of fan drive of air conditioner outdoor unit will now be described.

Figure 3:
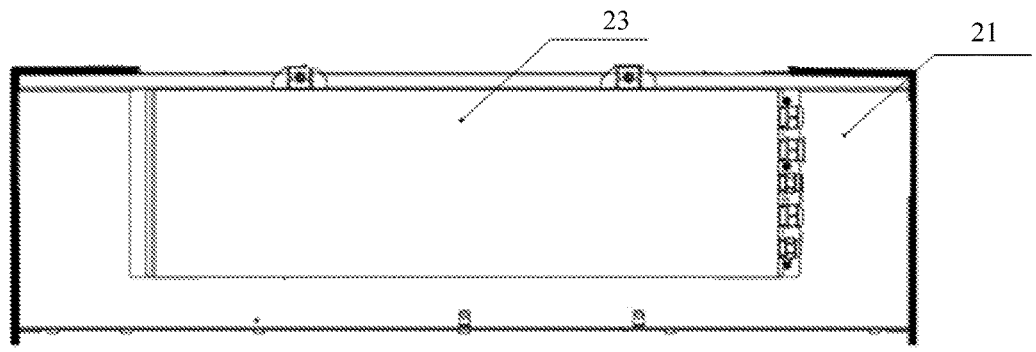
FIG. 3 is main view 2 of a heat dissipation structure of a fan drive of an air conditioner outdoor unit according to an embodiment of the present invention.
Figure 4:
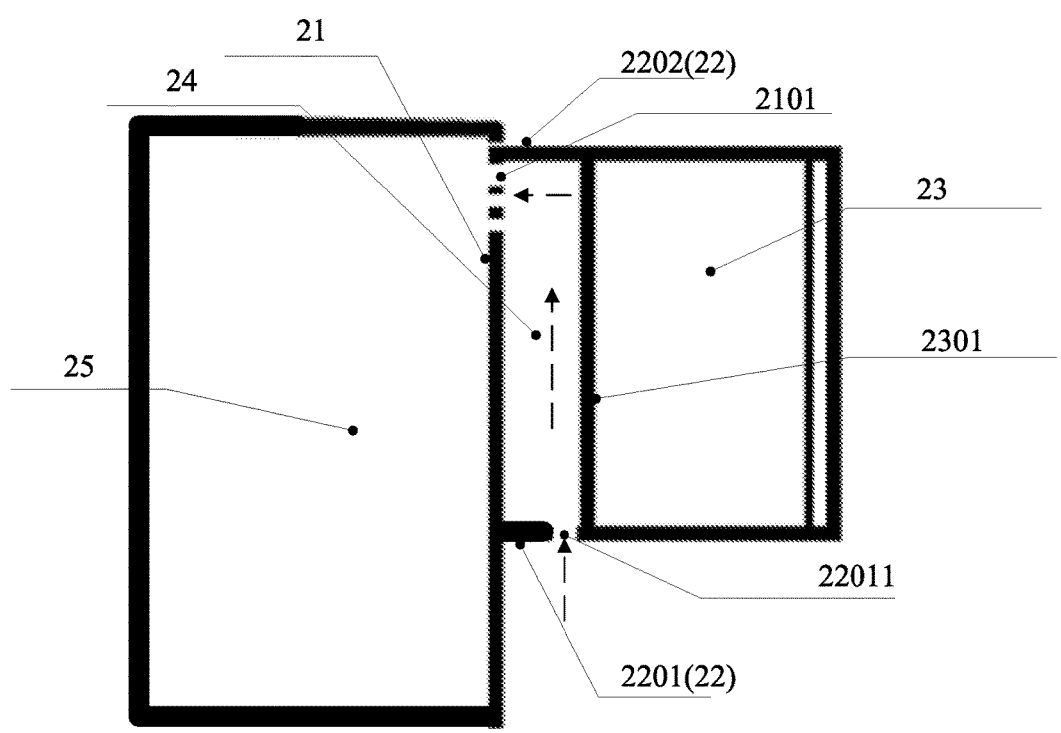
FIG. 4 is left view 2 of the heat dissipation structure of the fan drive of the air conditioner outdoor unit according to the embodiment of the present invention.

FIG. 3 is main view 2 of a heat dissipation structure of a fan drive of an air conditioner outdoor unit according to an embodiment of the present invention; and FIG. 4 is left view 2 of the heat dissipation structure of the fan drive of the air conditioner outdoor unit according to the embodiment of the present invention. As shown in FIG. 3 to FIG. 4, the heat dissipation structure of this embodiment includes: a side plate 21 of the air conditioner outdoor unit and a connecting plate 22. A gap 24 exists between the side plate 21 of the air conditioner outdoor unit and a side plate 2301 of the fan drive, the connecting plate 22 is connected to the side plate 2301 of the fan drive and the side plate 21 of the air conditioner outdoor unit, and the connecting plate 22 includes a first connecting sub-plate 2201.

The first connecting sub-plate 2201 is provided with a first air vent 22011, and the first air vent 22011 communicates with the outside of the air conditioner outdoor unit.

The side plate 21 of the air conditioner outdoor unit is provided with a second air vent 2101, the first air vent 22011 and the second air vent 2101 form an air duct (indicated by dotted lines in FIG. 4) between the side plate 21 of the air conditioner outdoor unit and the side plate 2301 of the fan drive, and the second air vent 2101 enables the first air vent 22011 to communicate with an inner chamber 25 of the air conditioner outdoor unit.

The fan drive 23 and the connecting plate 22 are on one side of the side plate 21 of the air conditioner outdoor unit, and the inner chamber 25 of the air conditioner outdoor unit is on the other side. A shape of the side plate 21 of the air conditioner outdoor unit may be rectangular, square, circular, or the like.

Shapes of the first air vent 22011 and the second air vent 2101 may be cellular, rectangular, circular, or the like. One or more first air vents 22011 and one or more second air vents 2101 may exist.

A relationship among an air speed and an air volume in the air duct, and a cross-sectional area of the air duct is shown in the above formula (1).

It should be noted that the cross-sectional area of the air duct is related to sizes of the gap, the first air vent, the second air vent, and a third air vent; and the sizes of the gap, the first air vent, the second air vent, and the third air vent may be determined according to values of an actually required air volume and air speed.

In this embodiment, a gap exists between a side plate of an air conditioner outdoor unit and a side plate of a fan drive, and a connecting plate is connected to the side plate of the fan drive and the side plate of the air conditioner outdoor unit; a first connecting sub-plate included by the connecting plate is provided with a first air vent, and the first air vent communicates with the outside of the air conditioner outdoor unit; and the side plate of the air conditioner outdoor unit is provided with a second air vent, the first air vent and the second air vent form an air duct between the side plate of the air conditioner outdoor unit and the side plate of the fan drive, and the second air vent enables the first air vent to communicate with an inner chamber of the air conditioner outdoor unit, so that heat dissipation on a fan drive can be implemented in a manner of adding a connecting plate and providing air vents on a side plate of an air conditioner outdoor unit and on the connecting plate, thereby simplifying a heat dissipation structure of the fan drive.

A fourth embodiment (Embodiment 4) of heat dissipation structure of fan drive of air conditioner outdoor unit will now be described.

Based on Embodiment 3 of the heat dissipation structure of the fan drive of the air conditioner outdoor unit, optionally, the connecting plate 22 may further include: a second connecting sub-plate 2202, a third connecting sub-plate (not shown), and a fourth connecting sub-plate (not shown); and the first connecting sub-plate 2201, the side plate 2301 of the fan drive, the second connecting sub-plate 2202, the third connecting sub-plate, and the fourth connecting sub-plate form an enclosed hexahedron. The first connecting sub-plate, the side plate of the fan drive, the second connecting sub-plate, the third connecting sub-plate, and the fourth connecting sub-plate form the enclosed hexahedron, so that the air duct is prevented from being affected by another gap between the side plate of the fan drive and the side plate of the air conditioner outdoor unit.

Optionally, the side plate 21 of the air conditioner outdoor unit is parallel with the side plate 2301 of the fan drive.

Optionally, the side plate 2301 of the fan drive is a bottom cover, on which an element of the fan drive is installed, of the fan drive; and contact heat dissipation is directly performed on the bottom cover on which the element of the fan drive is installed, thereby improving a heat dissipation effect.

Optionally, the first air vent 22011 and the second air vent 2101 are separately located on two sides of a central axis, perpendicular to the side plate 2301 of the fan drive, of the side plate 2301 of the fan drive. The first air vent and the second air vent are separately located on the two sides of the central axis, perpendicular to the side plate of the fan drive, of the side plate of the fan drive, so that the air duct, between the side plate of the air conditioner outdoor unit and the baffle plate, of the first air vent and the second air vent can cover a larger area of the side plate, tightly clinging to the side plate of the air conditioner outdoor unit, of the fan drive.

It should be noted that when an air conditioner is shut down and an internal temperature of the fan drive is higher than a preset temperature (for example, 75° C.), heat dissipation may be started for the fan drive; or heat dissipation may be performed on the fan drive while the air conditioner is operating.

Optionally, a fan driven by the fan drive may operate by extracting air or may operate by blowing air.

When the fan operates by extracting air, cool air outside the air conditioner outdoor unit enters between the side plate of the fan drive and the side plate of the air conditioner outdoor unit by means of the first air vent, and cools the fan drive. Hot air is then exhausted into the inner chamber of the air conditioner outdoor unit by means of the second air vent, and the hot air is extracted out by using the fan finally, thereby implementing heat dissipation on the fan drive by using the fan.

When the fan operates by blowing air, cool air outside the air conditioner outdoor unit is blown into the inner chamber of the air conditioner outdoor unit by using the fan, enters between the side plate of the fan drive and the side plate of the air conditioner outdoor unit by means of the second air vent, and cools the fan drive. Hot air is then blown out of the air conditioner outdoor unit by means of the first air vent, thereby implementing heat dissipation on the fan drive by using the fan.

When the air conditioner operates and the fan operates by extracting air, cool air outside the air conditioner outdoor unit enters by means of the first air vent and an air vent (for example, a fourth air vent) that is for performing heat dissipation on a condenser of the air conditioner, and cools the fan drive and the condenser, and hot air is then extracted out by using the fan, so that heat dissipation is performed on the fan drive by means of the first air vent and heat dissipation is performed on the condenser by means of the fourth air vent.

In this embodiment, heat dissipation on a fan drive is implemented in a manner of adding a connecting plate and providing air vents on a side plate of an air conditioner outdoor unit and on the connecting plate, so that a heat dissipation structure of a fan drive is simplified, while it is avoided to dispose a heat dissipation device for the fan drive, thereby reducing a weight and costs of the heat dissipation structure when compared with that a heat dissipation device is used as a heat dissipation structure of a fan drive.

A fifth embodiment (Embodiment 5) of heat dissipation structure of fan drive of air conditioner outdoor unit will now be described.

Figure 5:
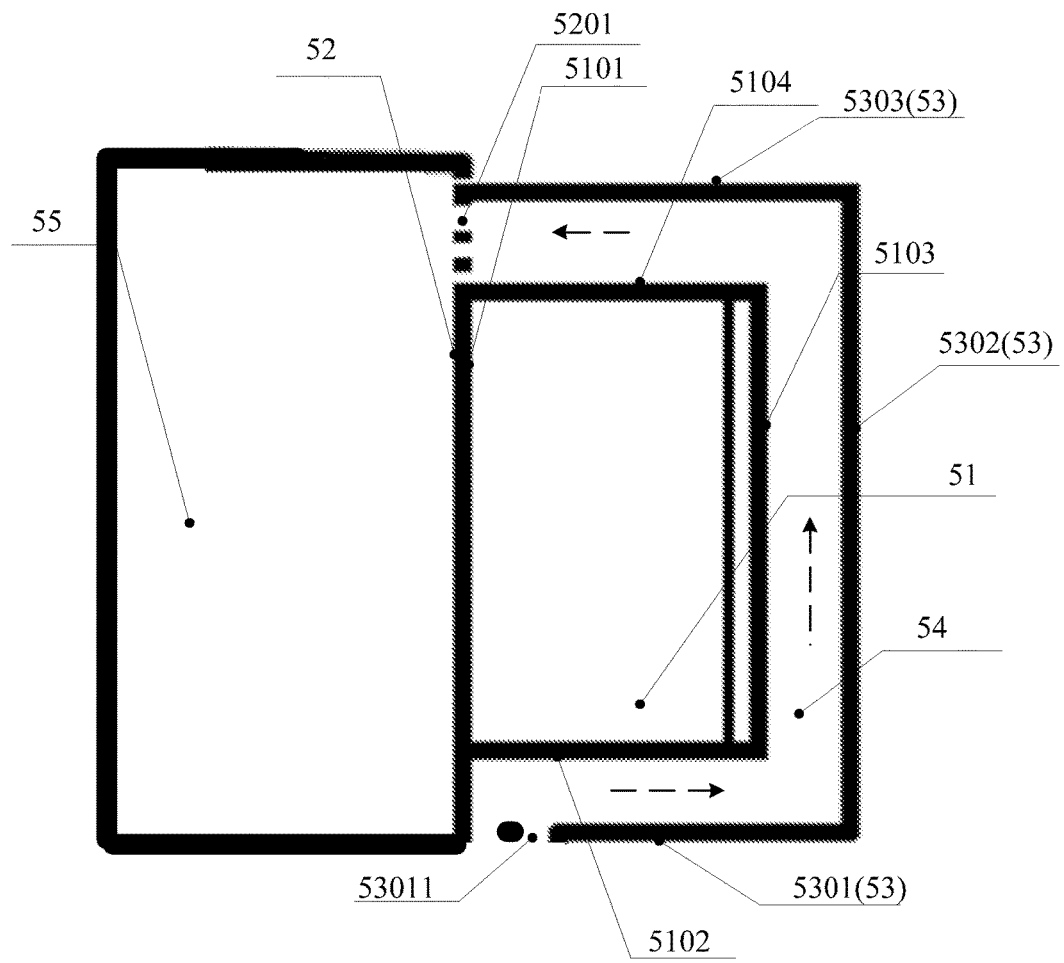
FIG. 5 is left view 3 of a heat dissipation structure of a fan drive of an air conditioner outdoor unit according to an embodiment of the present invention.

FIG. 5 is left view 3 of a heat dissipation structure of a fan drive of an air conditioner outdoor unit according to an embodiment of the present invention. As shown in FIG. 5, the heat dissipation structure of this embodiment includes: a fan drive 51, a side plate 52 of the air conditioner outdoor unit, and a connecting plate 53. The fan drive 51 includes: a first side plate 5101, a second side plate 5102, a third side plate 5103, and a fourth side plate 5104, where the first side plate 5101 tightly clings to the side plate 52 of the air conditioner outdoor unit, the second side plate 5102 is separately connected to the first side plate 5101 and the third side plate 5103, and the fourth side plate 5104 is separately connected to the third side plate 5103 and the first side plate 5101.

The connecting plate 53 includes: a first connecting sub-plate 5301, a second connecting sub-plate 5302, and a third connecting sub-plate 5303, where the first connecting sub-plate 5301 and the third connecting sub-plate 5303 are both connected to the side plate 52 of the air conditioner outdoor unit; the second connecting sub-plate 5302 is separately connected to the first connecting sub-plate 5301 and the third connecting sub-plate 5303; and the first connecting sub-plate 5301, the second connecting sub-plate 5302, and the third connecting sub-plate 5303 are located on an outer side of the second side plate 5102, an outer side of the third side plate 5103, and an outer side of the fourth side plate 5104, respectively, and a gap 54 exists between the first connecting sub-plate 5301 and the second side plate 5102, between the second connecting sub-plate 5302 and the third side plate 5103, and between the third connecting sub-plate 5303 and the fourth side plate 5104.

The first connecting sub-plate 5301 is provided with a first air vent 53011, and the first air vent 53011 communicates with the outside of the air conditioner outdoor unit.

The side plate 52 of the air conditioner outdoor unit is provided with a second air vent 5201, the first air vent 53011 and the second air vent 5201 form an air duct (indicated by dotted lines in FIG. 5) between the first connecting sub-plate 5301 and the second side plate 5102, between the second connecting sub-plate 5302 and the third side plate 5103, and between the third connecting sub-plate 5303 and the fourth side plate 5104, and the second air vent 5201 enables the first air vent 53011 to communicate with an inner chamber 55 of the air conditioner outdoor unit.

In this embodiment, a first connecting sub-plate, a second connecting sub-plate, and a third connecting sub-plate are located on an outer side of a second side plate, an outer side of a third side plate, and an outer side of a fourth side plate, respectively, and a gap exists between the first connecting sub-plate and the second side plate, between the second connecting sub-plate and the third side plate, and between the third connecting sub-plate and the fourth side plate; the first connecting sub-plate is provided with a first air vent, and the first air vent communicates with the outside of an air conditioner outdoor unit; and a side plate of the air conditioner outdoor unit is provided with a second air vent, the first air vent and the second air vent form an air duct between the first connecting sub-plate and the second side plate, between the second connecting sub-plate and the third side plate, and between the third connecting sub-plate and the fourth side plate, and the second air vent enables the first air vent to communicate with an inner chamber of the air conditioner outdoor unit, so that heat dissipation on a fan drive can be implemented in a manner of adding a connecting plate and providing air vents on a side plate of an air conditioner outdoor unit and on the connecting plate, thereby simplifying a heat dissipation structure of the fan drive.

A sixth embodiment (Embodiment 6) of heat dissipation structure of fan drive of air conditioner outdoor unit will now be described.

Based on Embodiment 5 of the heat dissipation structure of the fan drive of the air conditioner outdoor unit, optionally, the connecting plate 53 may further include: a fourth connecting sub-plate (not shown) and a fifth connecting sub-plate (not shown); and the first connecting sub-plate 5301, the second connecting sub-plate 5302, the third connecting sub-plate 5303, the fourth connecting sub-plate, the fifth connecting sub-plate, the second side plate 5102, the third side plate 5103, the fourth side plate 5104, and the side plate 52 of the air conditioner outdoor unit form an enclosed body, so that the air duct is prevented from being affected by another gap among the second side plate, the third side plate and the fourth side plate of the fan drive, the first connecting sub-plate, the second connecting sub-plate, and the third connecting sub-plate.

Optionally, the first connecting sub-plate 5301 is parallel with the second side plate 5102; the second connecting sub-plate 5302 is parallel with the third side plate 5103; and the third connecting sub-plate 5303 is parallel with the fourth side plate 5104.

Optionally, the second side plate 5102, or the third side plate 5103, or the fourth side plate 5104 is a bottom cover, on which an element of the fan drive is installed, of the fan drive; and contact heat dissipation is directly performed on the bottom cover on which the element of the fan drive is installed, thereby improving a heat dissipation effect.

It should be noted that when an air conditioner is shut down and an internal temperature of the fan drive is higher than a preset temperature (for example, 75° C.), heat dissipation may be started for the fan drive; or heat dissipation may be performed on the fan drive while the air conditioner is operating.

Optionally, a fan driven by the fan drive may operate by extracting air or may operate by blowing air.

When the fan operates by extracting air, cool air outside the air conditioner outdoor unit enters between the connecting plate and the side plate of the fan drive by means of the first air vent, and cools the fan drive. Hot air is then exhausted into the inner chamber of the air conditioner outdoor unit by means of the second air vent, and the hot air is extracted out by using the fan finally, thereby implementing heat dissipation on the fan drive by using the fan.

When the fan operates by blowing air, cool air outside the air conditioner outdoor unit is blown into the inner chamber of the air conditioner outdoor unit by using the fan, enters between the connecting plate and the side plate of the fan drive by means of the second air vent, and cools the fan drive. Hot air is then blown out of the air conditioner outdoor unit by means of the first air vent, thereby implementing heat dissipation on the fan drive by using the fan.

In this embodiment, heat dissipation on a fan drive is implemented in a manner of adding a connecting plate and providing air vents on a side plate of an air conditioner outdoor unit and on the connecting plate, so that a heat dissipation structure of a fan drive is simplified, while it is avoided to dispose a heat dissipation device for the fan drive, thereby reducing a weight and costs of the heat dissipation structure when compared with that a heat dissipation device is used as a heat dissipation structure of a fan drive.

The present invention further provides an air conditioner outdoor unit, including a heat dissipation structure, such as the heat dissipation structure of the fan drive described in Embodiment 1, or Embodiment 2, or Embodiment 3, or Embodiment 4, or Embodiment 5, or Embodiment 6.

Figure 6:
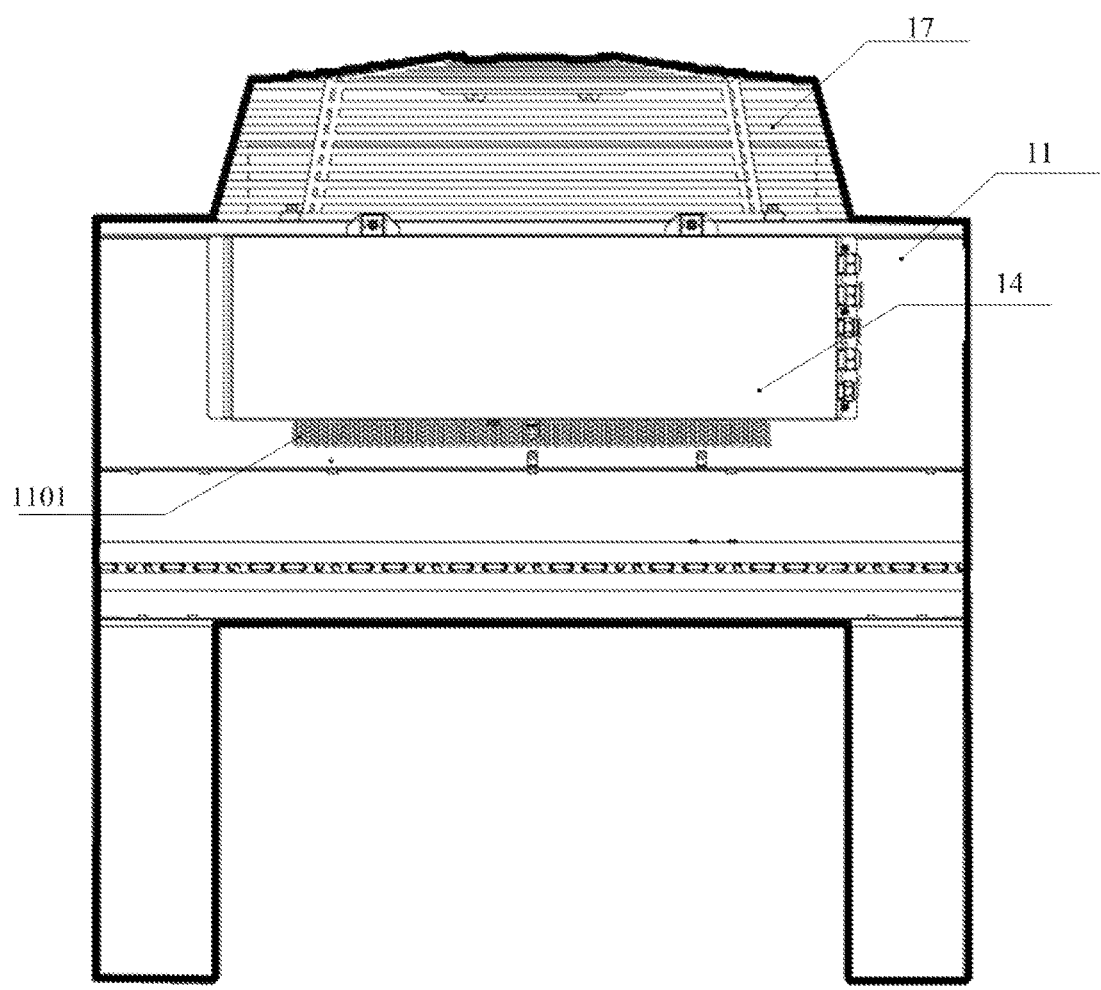
FIG. 6 is main view 1 of an air conditioner outdoor unit according to an embodiment of the present invention.
Figure 7:
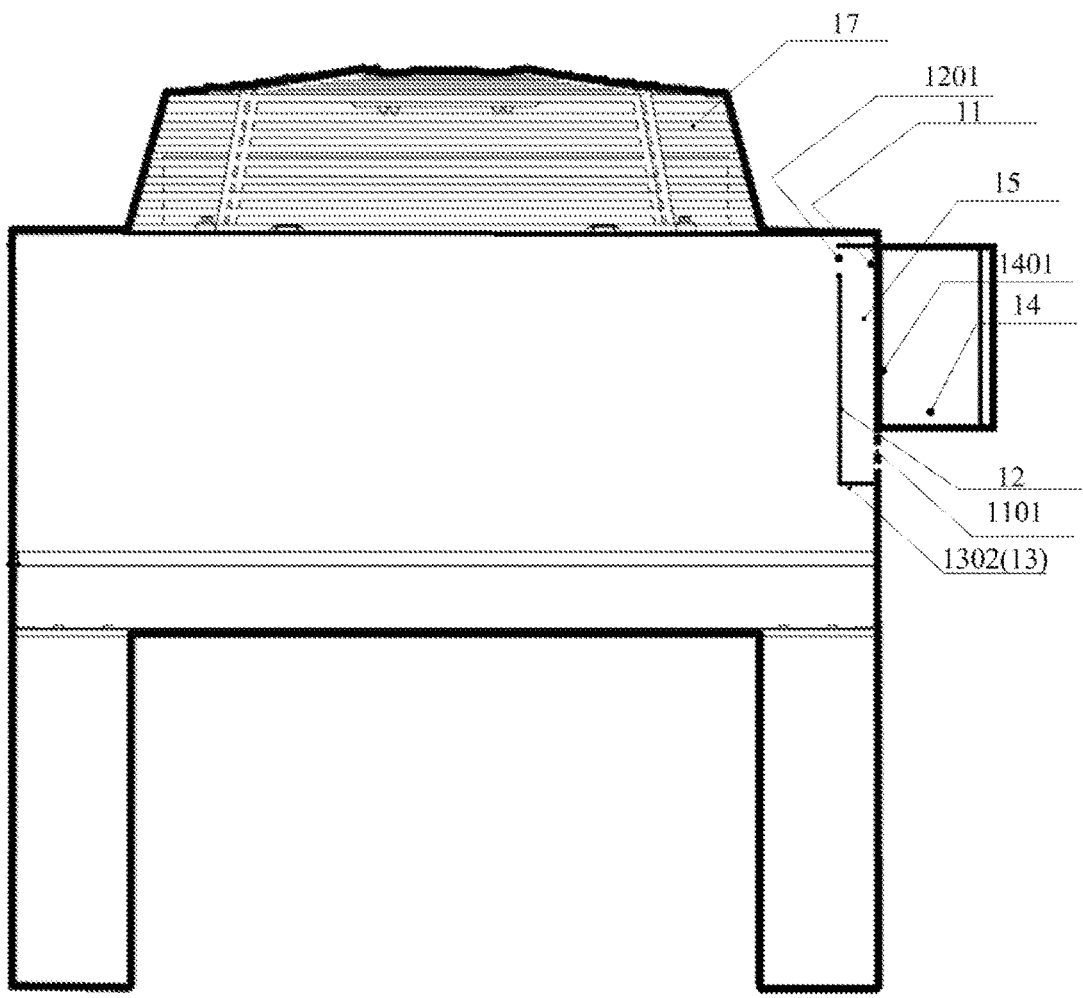
FIG. 7 is left view 1 of the air conditioner outdoor unit according to the embodiment of the present invention.

FIG. 6 is main view 1 of an air conditioner outdoor unit according to an embodiment of the present invention; and FIG. 7 is left view 1 of the air conditioner outdoor unit according to the embodiment of the present invention. FIG. 6 and FIG. 7 are a main view and a left view of the air conditioner outdoor unit corresponding to Embodiment 1 or Embodiment 2 of the heat dissipation structure, respectively.

Figure 8:
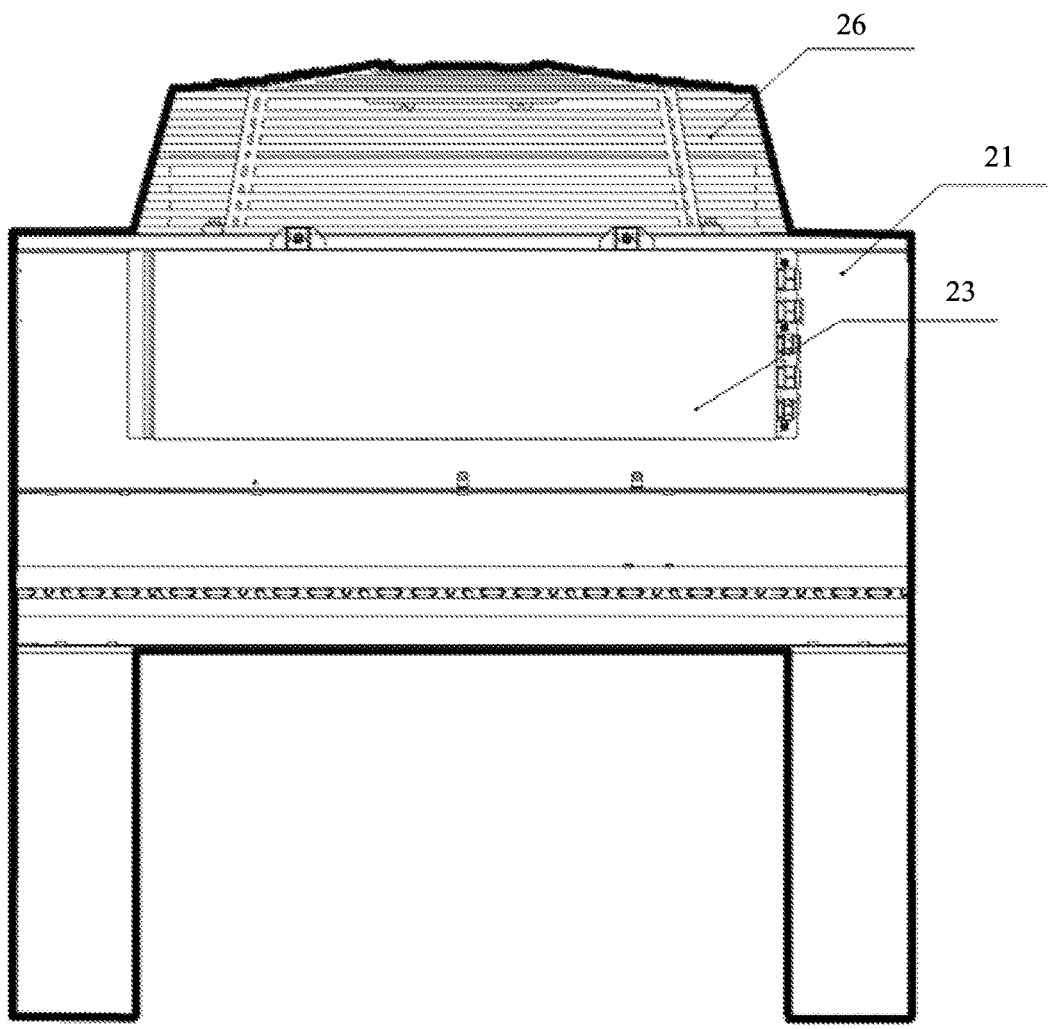
FIG. 8 is main view 2 of an air conditioner outdoor unit according to an embodiment of the present invention.
Figure 9:
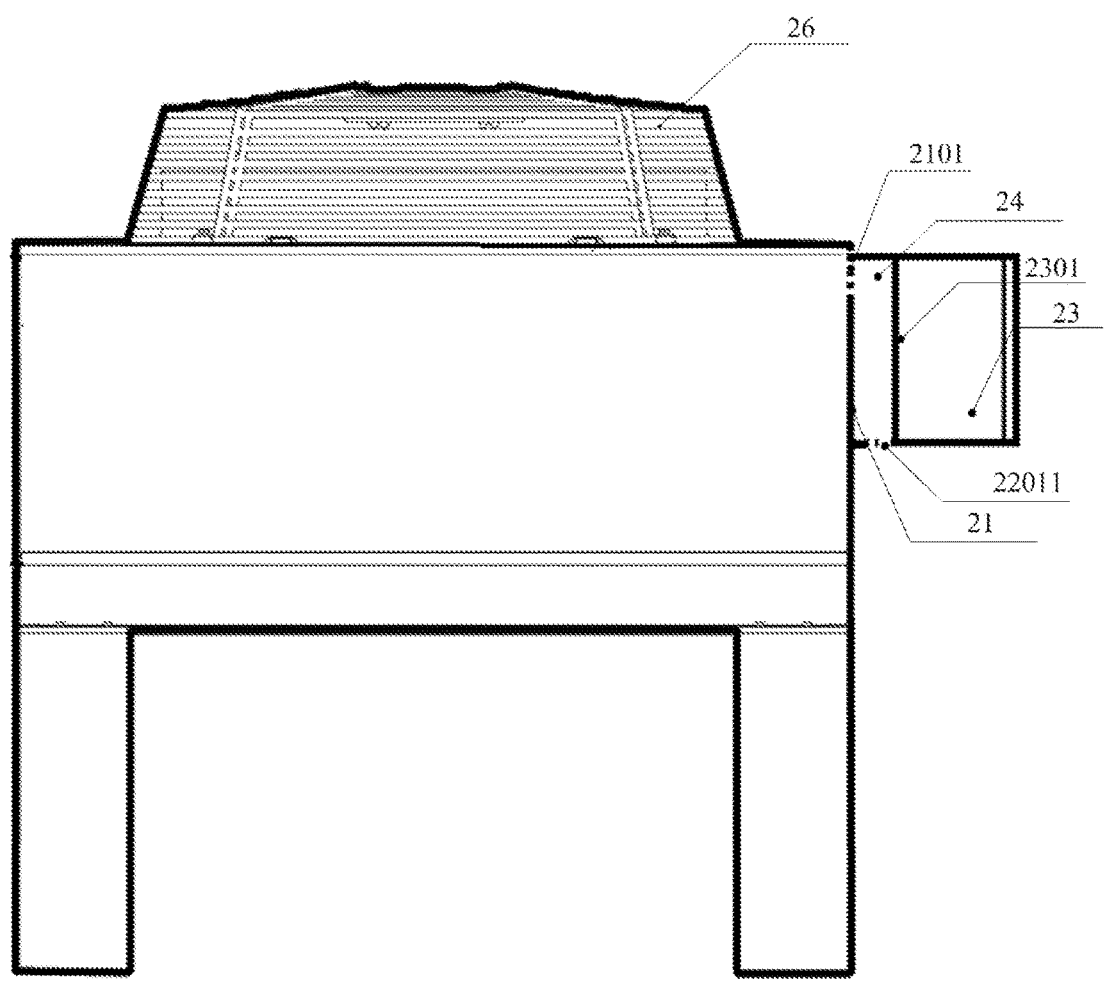
FIG. 9 is left view 2 of the air conditioner outdoor unit according to the embodiment of the present invention.

FIG. 8 is main view 2 of an air conditioner outdoor unit according to an embodiment of the present invention; and FIG. 9 is left view 2 of the air conditioner outdoor unit according to the embodiment of the present invention. FIG. 8 and FIG. 9 are a main view and a left view of the air conditioner outdoor unit corresponding to Embodiment 3 or Embodiment 4 of the heat dissipation structure, respectively.

Figure 10:
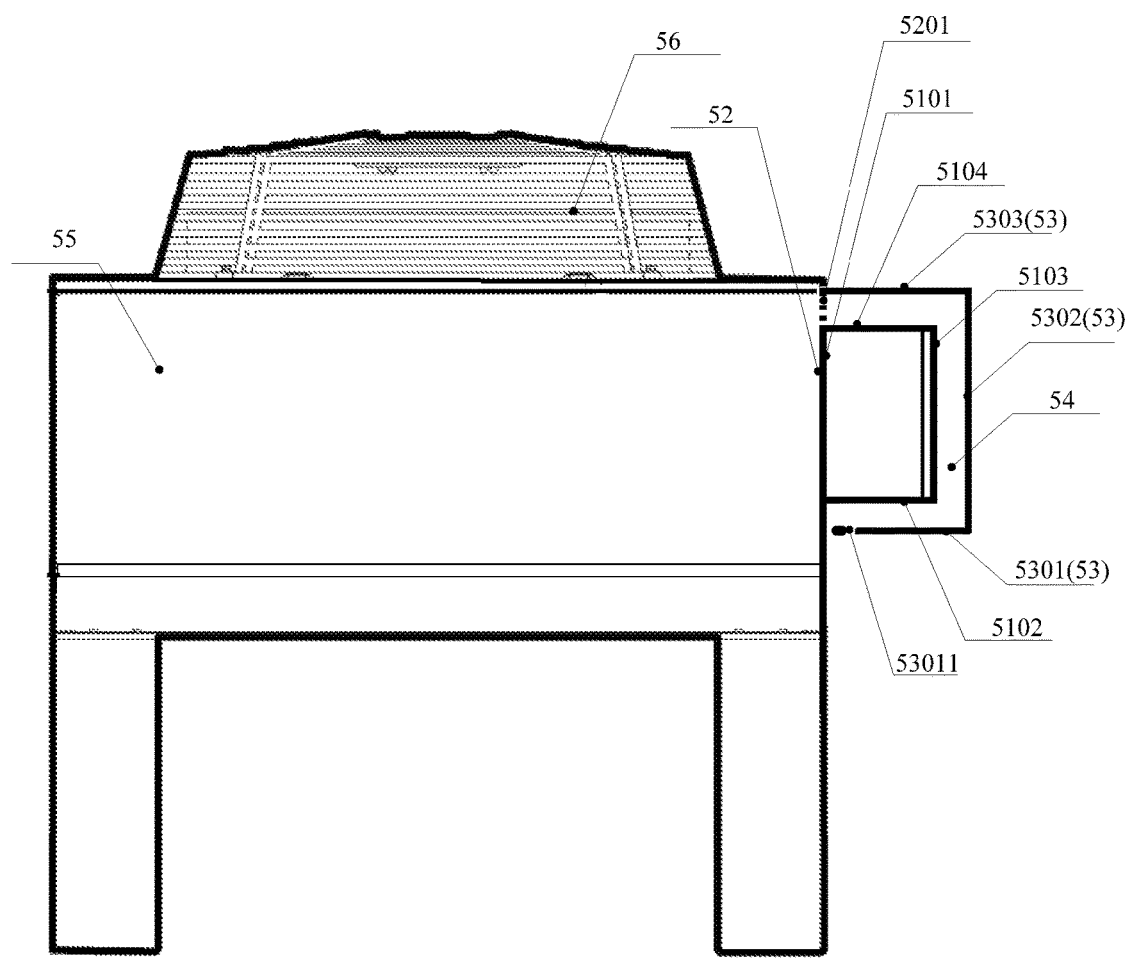
FIG. 10 is left view 3 of an air conditioner outdoor unit according to an embodiment of the present invention.

FIG. 10 is left view 3 of an air conditioner outdoor unit according to an embodiment of the present invention. FIG. 10 is a left view of the air conditioner outdoor unit corresponding to Embodiment 5 or Embodiment 6 of the heat dissipation structure.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A heat dissipation structure of a fan drive of an air conditioner outdoor unit, comprising:
   a side plate of the air conditioner outdoor unit; and
   a baffle plate;
   wherein the side plate of the air conditioner outdoor unit is disposed between a side plate of the fan drive and the baffle plate;
   wherein a gap exists between the side plate of the air conditioner outdoor unit and the baffle plate;
   wherein the side plate of the air conditioner outdoor unit clings to the side plate of the fan drive;
   wherein the side plate of the air conditioner outdoor unit is provided with a first air vent that communicates with an outside of the air conditioner outdoor unit;
   wherein a second air vent is provided on the baffle plate;
   wherein the first air vent and the second air vent form an air duct between the side plate of the air conditioner outdoor unit and the baffle plate; and
   wherein the second air vent enables the first air vent to communicate with an inner chamber of the air conditioner outdoor unit.

2. The heat dissipation structure according to claim 1, further comprising a connecting plate connected to the baffle plate and the side plate of the air conditioner outdoor unit, the connecting plate comprising a first connecting sub-plate, a second connecting sub-plate, a third connecting sub-plate, and a fourth connecting sub-plate, wherein the baffle plate, the side plate of the air conditioner outdoor unit, the first connecting sub-plate, the second connecting sub-plate, the third connecting sub-plate, and the fourth connecting sub-plate form an enclosed hexahedron.

3. The heat dissipation structure according to claim 1, wherein the baffle plate is parallel with the side plate of the air conditioner outdoor unit.

4. The heat dissipation structure according to claim 1, wherein the side plate of the fan drive comprises a bottom cover, on which an element of the fan drive is installed.

5. The heat dissipation structure according to claim 1, wherein the first air vent and the second air vent are separately located on two sides of a central axis of the side plate of the fan drive and perpendicular to the side plate of the fan drive.

6. An air conditioner outdoor unit, comprising the heat dissipation structure according to claim 1.

7. The heat dissipation structure according to claim 1, wherein the side plate of the air conditioner outdoor unit has a rectangular shape.

8. The heat dissipation structure according to claim 1, wherein the baffle plate has a rectangular shape.

9. The heat dissipation structure according to claim 1, wherein a size of the gap is determined according to an air volume and an air speed that are required.

10. An air conditioner outdoor unit comprising a heat dissipation structure, the heat dissipation structure comprising a side plate of the air conditioner outdoor unit disposed between a side plate of a fan drive and a baffle plate of the air conditioner outdoor unit, wherein a gap exists between the side plate of the air conditioner outdoor unit and the baffle plate, and the side plate of the air conditioner outdoor unit clings to the side plate of the fan drive, wherein the side plate of the air conditioner outdoor unit is provided with a first air vent that communicates with an outside of the air conditioner outdoor unit, and a second air vent is provided on the baffle plate, wherein the first air vent and the second air vent form an air duct between the side plate of the air conditioner outdoor unit and the baffle plate, and the second air vent enables the first air vent to communicate with an inner chamber of the air conditioner outdoor unit.

11. The air conditioner outdoor unit according to claim 10, wherein the heat dissipation structure further comprises a connecting plate connected to the baffle plate and the side plate of the air conditioner outdoor unit, the connecting plate comprising a first connecting sub-plate, a second connecting sub-plate, a third connecting sub-plate, and a fourth connecting sub-plate, wherein the baffle plate, the side plate of the air conditioner outdoor unit, the first connecting sub-plate, the second connecting sub-plate, the third connecting sub-plate, and the fourth connecting sub-plate form an enclosed hexahedron.

12. The air conditioner outdoor unit according to claim 10, wherein the baffle plate is parallel to the side plate of the air conditioner outdoor unit.

13. The air conditioner outdoor unit according to claim 10, wherein the first air vent and the second air vent are separately located on two sides of a central axis of the side plate of the fan drive that is perpendicular to the side plate of the fan drive.

14. The air conditioner outdoor unit according to claim 10, wherein the side plate of the air conditioner outdoor unit or the baffle plate has a rectangular shape.

15. The air conditioner outdoor unit according to claim 10, wherein a size of the gap is determined according to an air volume and an air speed required.

\* \* \* \* \*